United States Patent [19]
Moore

[11] Patent Number: 6,100,816
[45] Date of Patent: Aug. 8, 2000

[54] UTILITY METER ADAPTER

[75] Inventor: Robby J. Moore, Redwood City, Calif.

[73] Assignee: Cellnet Data Systems, Inc., San Carlos, Calif.

[21] Appl. No.: 09/008,273

[22] Filed: Jan. 16, 1998

[51] Int. Cl.[7] .................................................. G08B 23/00
[52] U.S. Cl. ................................ 340/870.02; 340/870.32; 73/273; 73/861.79
[58] Field of Search ......................... 340/870.02, 870.32, 340/870.33; 73/272 A, 273, 277, 861.77, 861.78, 861.79, 861.93, 861.94, 861.87

[56] References Cited

U.S. PATENT DOCUMENTS

| | | | |
|---|---|---|---|
| 3,425,275 | 2/1969 | Russell, Jr. et al. | 73/273 |
| 3,928,788 | 12/1975 | Finnen et al. | 317/111 |
| 3,943,441 | 3/1976 | Shackford | 324/110 |
| 4,068,288 | 1/1978 | Finnen | 361/369 |
| 4,146,258 | 3/1979 | Andruchiw | 292/256 |
| 5,421,201 | 6/1995 | Pellerin, Jr. | 73/272 |
| 5,559,870 | 9/1996 | Patton et al. | 379/107 |
| 5,777,222 | 7/1998 | Roberts | 73/273 |

*Primary Examiner*—Michael Horabik
*Assistant Examiner*—Timothy Edwards, Jr.
*Attorney, Agent, or Firm*—Fish & Richardson P.C.

[57] ABSTRACT

An adapter module mounts on a utility meter having one or more meter dials. The adapter module has a cover and a mating bracket. The cover includes a plurality of bosses extending from a front side of the cover to a rear side of the cover. The bosses are spaced a predetermined distance from a cover perimeter to provide space for ribs inside the adapter to provide extra support. The cover also has a tamper-proof magnet housing extending from the rear side of said cover and a front battery chamber portion to receive a battery. The mating bracket has a rear battery chamber which, in combination with the front battery chamber, houses one or more batteries. The bracket also has a printed circuit board (PCB) chamber which is adapted to receive a PCB with electronics on-board. The bracket also has a recess which receives a dial dog. The dial dog has a gear for driving original dials of the meter. The dial dog is driven by a meter dog, which in turn is connected to a gear on the original meter. The dial dog has a magnet mounted therein to convert the gear rotations into magnetic pulses detectable by the electronics on the PCB. The magnetic pulse information is captured, digitized and transmitted to a remote location for processing.

24 Claims, 7 Drawing Sheets

UTILITY METER ADAPTER

BACKGROUND

The present invention relates to a utility meter adapter, and more particularly to an adapter for retrofitting a utility meter to support remote data collection.

Advances in living standards may be attributed in part to the development and commercialization of various utility products such as electricity and gas. In allocating costs associated with these utility products, utility companies typically gauge consumption using meters and bill their customers accordingly. Traditionally, at the end of a reporting period, a utility employee physically inspects and records each customer's meter readout dials which reflect usage. The recorded data is eventually re-entered into an accounting system for billing purposes. This process is labor intensive and duplicative. Moreover, the meter reading process may be disrupted by unplanned nuisances such as dogs and inclement weather. Further, this process cannot provide time-of-day metering so that the utility company can charge for the utility product as a function of load factors.

Attempts have been made in recent years to develop automatic meter reading systems which can automatically capture consumption data from the field. Although existing meters may be replaced with new meters that provide an automatic meter reading capability, such a wholesale replacement is uneconomical in light of the large number of meters that need to be updated. Thus, adapter modules have been developed which allow existing meters to be retrofitted to provide the remote data collection capability economically until the older meters have been completely phased out. The use of adapter modules also enables meter manufacturers to continue their production of standard meters while providing an optional capability of remote data collection when required by the customer.

Although cost effective, certain adapter modules have been found to be unreliable in the field, requiring that they be replaced. These problems stem in part from weak structural supports between the adapter module and the original meter housing. These adapter modules are more susceptible to shear forces than the original meter and thus more fragile.

Additionally, some adapter modules are susceptible to invasive and noninvasive tampering attempts which may prevent these adapter modules from operating properly. Further, certain adapter modules may have profiles that prevent them from being used in low profile applications.

Further, adapter modules may provide inadequate weatherproofing for their power supplies. Alternatively, certain adapter modules may use an excessive amount of weatherproofing such as by injecting sealants to completely fill the inside of the modules. In such instances, the power supplies such as batteries are not field-replaceable.

Moreover, certain adapter modules are typically complex to assemble and may require considerable time and effort to install in the field. In this respect, they may be expensive to deploy.

SUMMARY

An adapter works with a utility meter to provide remote data collection capability. The adapter has a cover with a plurality of bosses extending from a front side of the cover to a rear side of the cover. Each boss is spaced a predetermined distance from a perimeter of the cover. The bosses act as ribs inside the adapter to provide extra support.

The adapter provides a battery chamber formed by a bracket and the cover to receive a power source such as a battery. The adapter has a passageway which is connected to the battery chamber and which is adapted to be sealed to weatherproof the battery.

The adapter also provides a recess for receiving a dial dog. The dial dog is rotationally coupled to a gear on the original meter and rotates along with the meter gear. The dial dog has a magnet mounted thereon to convert rotations associated with the meter dials to magnetic pulses.

Implementations of the invention include the following. A tamper-proof magnet housing may extend from the rear side of the cover. The tamper-proof magnet housing is adapted to receive a tamper-detection system with a magnet and associated electronics to counteract tampering attempts. The cover also has a battery chamber portion, which in combination with a second battery chamber portion on the bracket, houses one or more batteries.

The bracket has a printed circuit board (PCB) chamber which is adapted to receive a PCB with electronics mounted thereon. A sealable passageway connects the printed circuit board chamber to the battery chamber portion of the bracket. Circuitry on-board the PCB digitizes and transmits the magnetic pulses to a processing center.

Moreover, the dial dog is linked with gears, or equivalently tangs, on the original meter via a meter dog. The dial dog has an interlocking boss which receives an arm of the meter dog. The meter dog arm has snappable wings which, upon insertion into the interlocking boss, secures the meter dog to the dial dog. As the dial dog rotates, a gear on the dial dog drives dials mounted in the adapter to continue to provide a visual display of consumption data.

In one aspect, the dial dog may have posts with breakable arms. During a cold spell where the dials may become saturated with frost or water and seize, the arm breaks away and continues to rotate. Hence, gas usage may still be metered, even though the meter dials have seized.

Advantages of the invention include the following. The adapter module protects its components from physical stresses experienced in the field. The internal ribs of the adapter module provide a beam-like reinforcement to the adapter module casing to prevent shearing and breaking of the adapter module in the field during installation as well as during operation. Further, the low profile of the adapter module allows it to be deployed in a wide range of environments.

The adapter module also requires few parts, which in turn minimizes manufacturing costs. The low part count also increases the overall reliability of the adapter module of the present invention. Moreover, the adapter module is easy to assemble. The low part count also reduces the inventory cost as well as the number of components which must be maintained for spares and for repair purposes.

The waterproofing of the battery chamber is also enhanced without requiring that the entire inside of the adapter module be filled with a sealant. Hence, the battery is field-replaceable.

Moreover, even in very cold conditions, the adapter module can continue to count, even though the meter dials and dial dogs may be frozen. Additionally, the adapter module supports invasive as well as non-invasive tamper detection to minimize a potential loss or corruption of consumption data.

DESCRIPTION

Figure 1A:
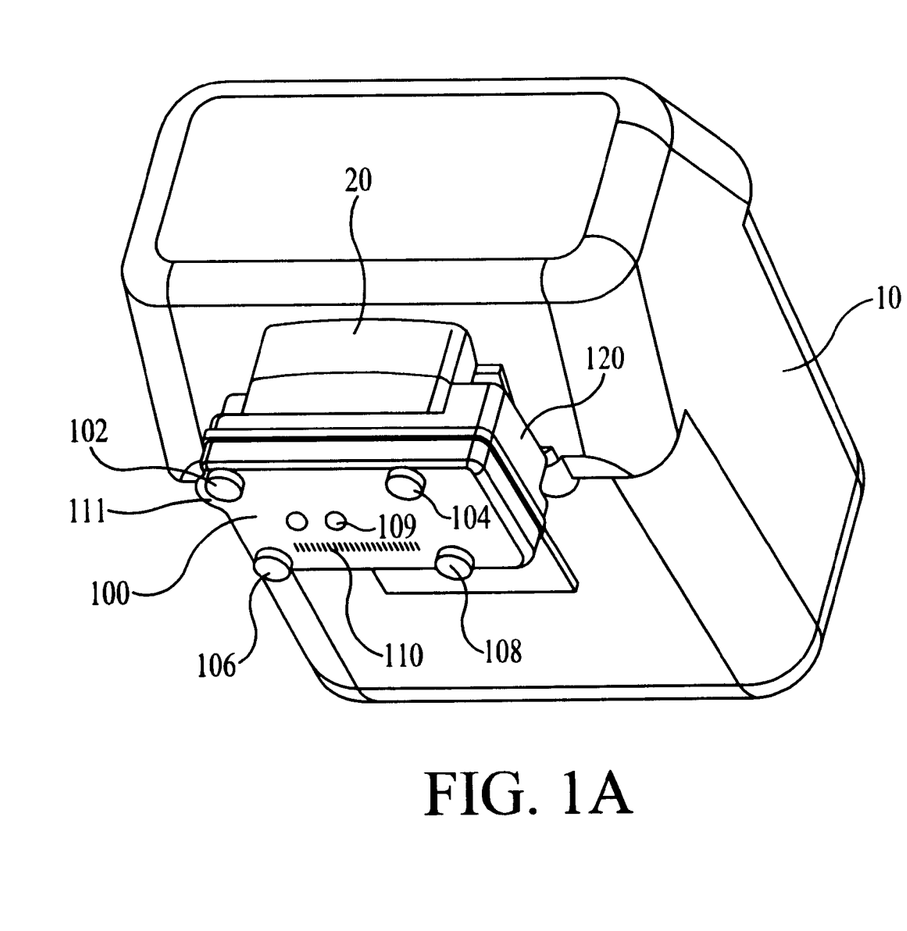
FIG. 1A is a perspective side view of an adapter module in accordance with the invention.
Figure 1B:
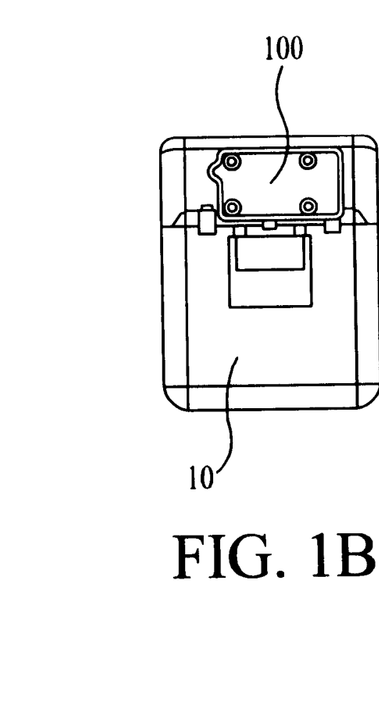
FIG. 1B is a frontal view of the adapter module of FIG. 1A.
Figure 1C:
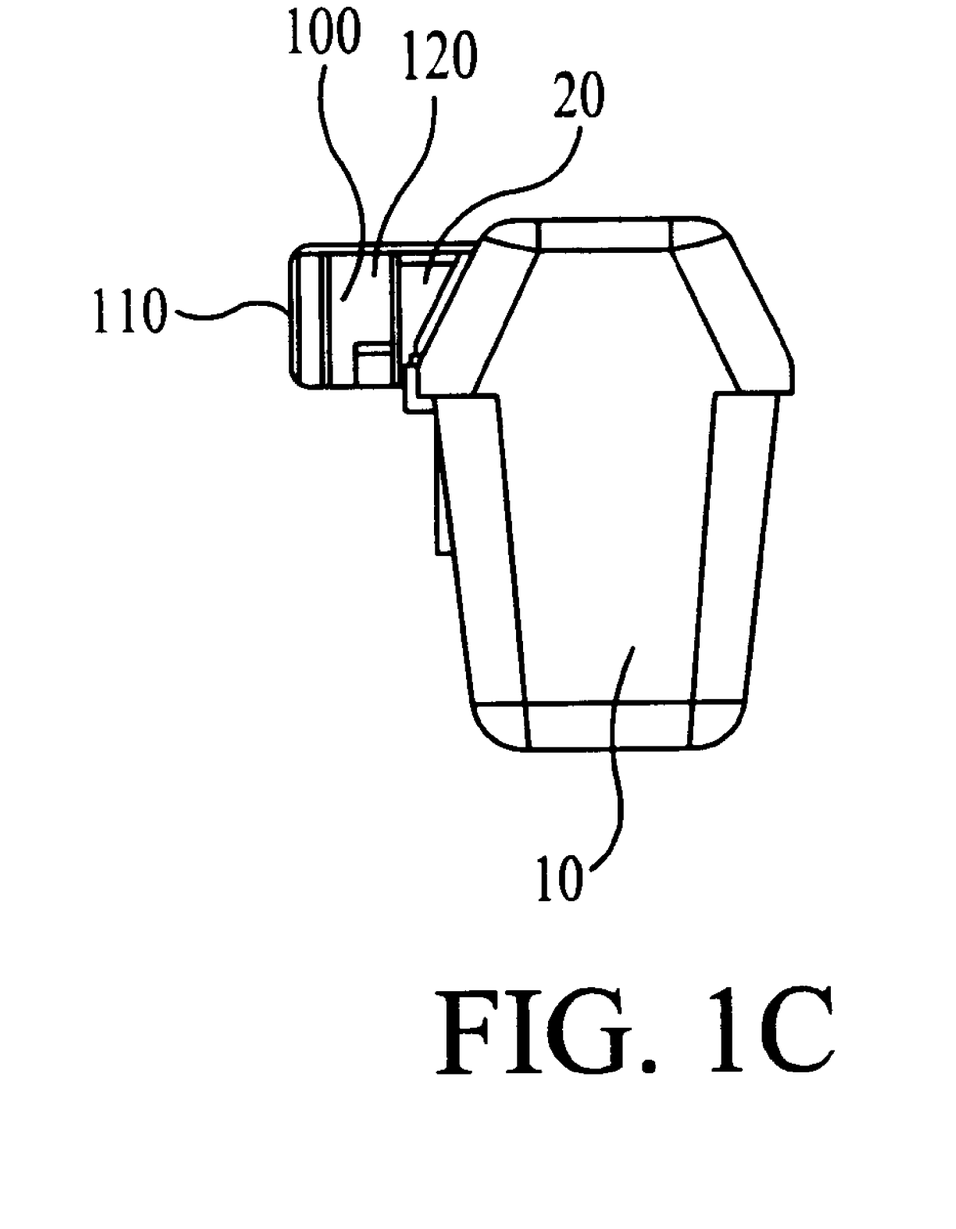
FIG. 1C is a side view of the adapter module of FIG. 1A.

FIGS. 1A, 1B and 1C show an adapter module 100 mounted on an original meter 10. The original meter 10, in this case a gas meter, conventionally displays usage information by a mechanical dial index interface with dials 109 located on an interface housing 20. The dials 109 are physically coupled to and rotate in proportion to rotations of gears (not shown) on the original meter 10 which indicate the gas consumption. During the retrofitting process, the dials 109 are removed from their respective gears on the original meter 10. The adapter module 10 is mounted in place of the dials so that it can capture the gear rotations and convert the gear rotations into consumption data. Once the adapter module 100 has been installed, the dials 109 are mounted in the adapter module 10 to provide the usual display of dials which rotate to indicate consumption.

To provide a linkage from the original meter's gears to the dials 109 inside the adapter module 100, a dial dog (FIGS. 5A and 5B) and a meter dog (FIGS. 4A and 4B) are provided. As the dials on the dial index interface rotate, the meter dog on the adapter module 100 also rotates. The meter dog in turn rotates the dial dog with a magnet mounted therein. The rotation of the dial dog with the magnet generates an electromagnetic pulse which may be digitized and counted by electronics within the adapter module 100. The adapter module 100 then relays the consumption data via a land-based or wireless transmitter to a remote location for accounting purposes.

As shown in FIG. 1A, the meter module 100 has a cover 110 and a bracket 120, both made from a polymer material. The combination of the cover 110 and the bracket 120 results in a low profile module 100 when compared against the dimensions of the original meter 10. The low-profile of the adapter module 100 allows it to be used in environments with minimal clearance requirements.

The cover 110 is made from a clear polymer material to allow a customer or a utility inspector visual access to the dials 109. The bracket 120 is adapted to engage the dial index interface on the interface housing 20. The cover 110 is secured to the bracket 120 by a plurality of bolts 102, 104, 106 and 108. As discussed below, the bolts 102, 104, 106 and 108 pass through a number of bosses that are spaced a predetermined distance from a perimeter of the cover 110 to provide space for ribs inside the adapter 100 which provide extra support.

Additionally, the cover 110 and the bracket 120 in combination provide an extension or protrusion 111 which houses a tamper-detection magnet. As discussed below, the tamper-detection magnet is activated by an unauthorized attempt to open or otherwise affect the proper operation of the adapter module 100. The protrusion 111 may be either external, as shown in FIG. 1A, or may be internal to the adapter module 100.

Figure 2A:
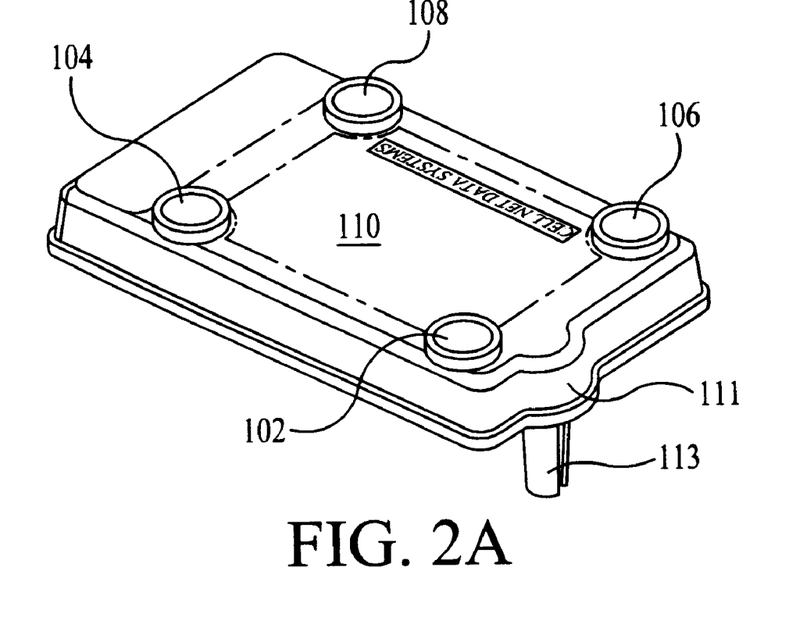
FIGS. 2A and 2B are perspective front and back views, respectively, of a cover of the adapter module of FIG. 1A.
Figure 2B:
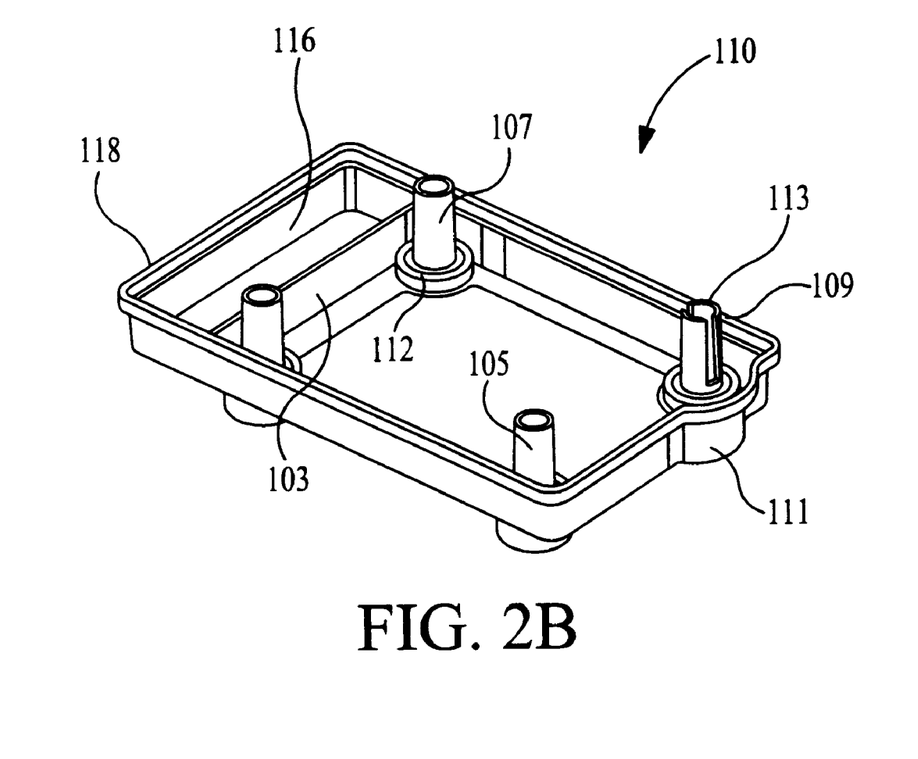

Referring now to FIGS. 2A and 2B, a plurality of bosses or counter-bores 103, 105, 107 and 109 are positioned a predetermined distance from a perimeter of the cover 110. The bosses 103, 105, 107 and 109 are adapted to receive the bolts 102, 104, 106 and 108 which secure the cover 110 to the bracket 120. Since the bolts 102, 104, 106 and 108 are within an enclosure and supported by the bosses 103, 105, 107 and 109 which form extra ribs, the resulting adapter module 100 is stronger than an assembly which positions the bolts directly on the perimeter of the cover.

Next to the boss 109 is the protrusion 111 with a tamper magnet housing 113. The tamper magnet housing 113 is adapted to receive a tamper magnet (not shown) which, when the cover 110 is closed, is positioned adjacent to one or more magnetic switches mounted on a printed circuit board (PCB) of the module's electronics. When the cover 110 is removed without proper authorization, the magnetic switches are actuated and the adapter module's circuitry generates and transmits an alarm to a remote system controller. The remote system controller flags the tamper attempt to alert utility company personnel. Additionally, in the event that the customer attempts to perform a noninvasive tamper, such as by placing a strong magnet adjacent to the adapter module 100 to cause the magnetic switches to fail, the magnetic switches on the adapter module 100 detect such attempt and generate an alarm to the remote system controller.

FIG. 2B shows a front portion of a battery compartment 116 formed inside the cover 110 for containing a replaceable battery (not shown). When the battery is dead, only the front cover 110 needs to be removed in order to access and replace the battery. FIG. 2B also shows a ledge 118 which is formed on the perimeter of the cover 110 to accommodate a gasket (not shown). The gasket may be either a form-in-place gasket or a die-cut gasket which is used to seal the entire perimeter of the cover 110 when it is placed against the bracket 120. The gasket keeps water, dirt and other contaminants away from the battery chamber 116 and components inside the meter module.

Figure 3A:
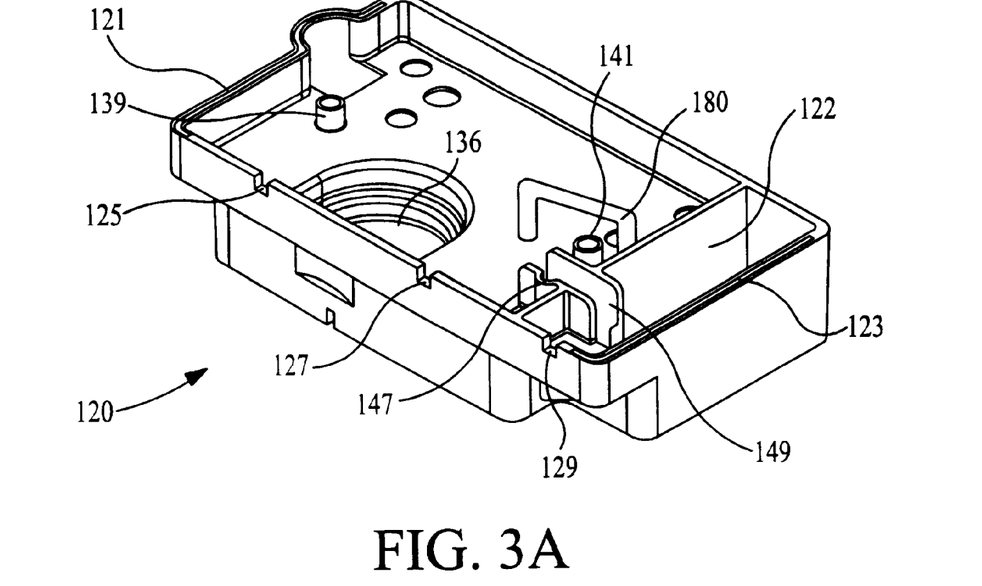
FIGS. 3A and 3B are perspective front and back views, respectively, of a bracket of the adapter module of FIG. 1A.
Figure 3B:
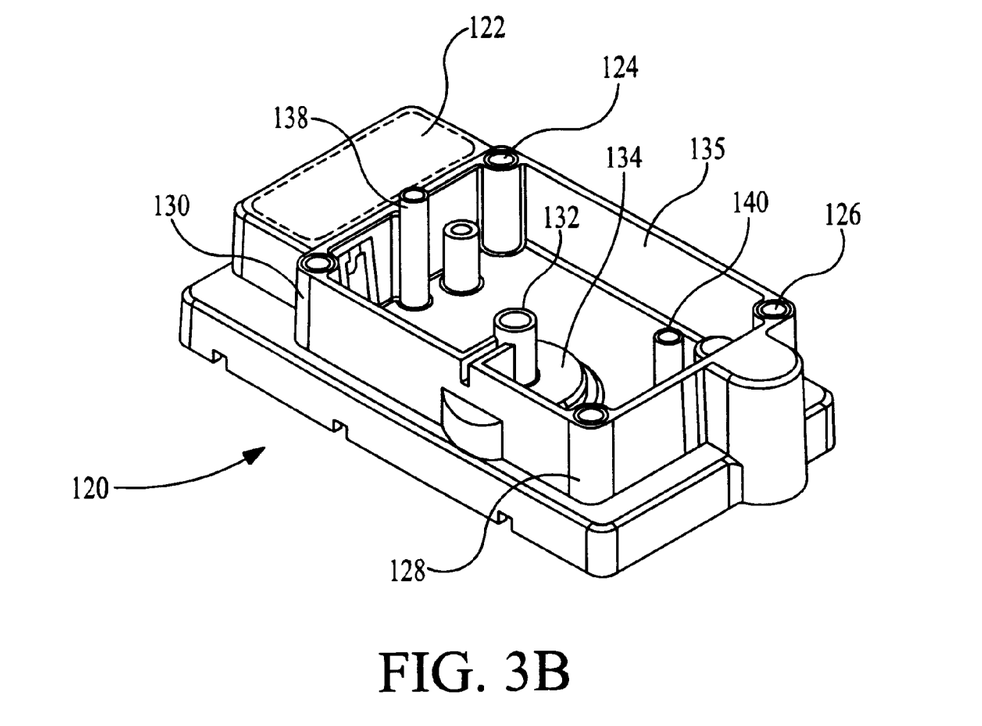
Figures 4A, 4B:
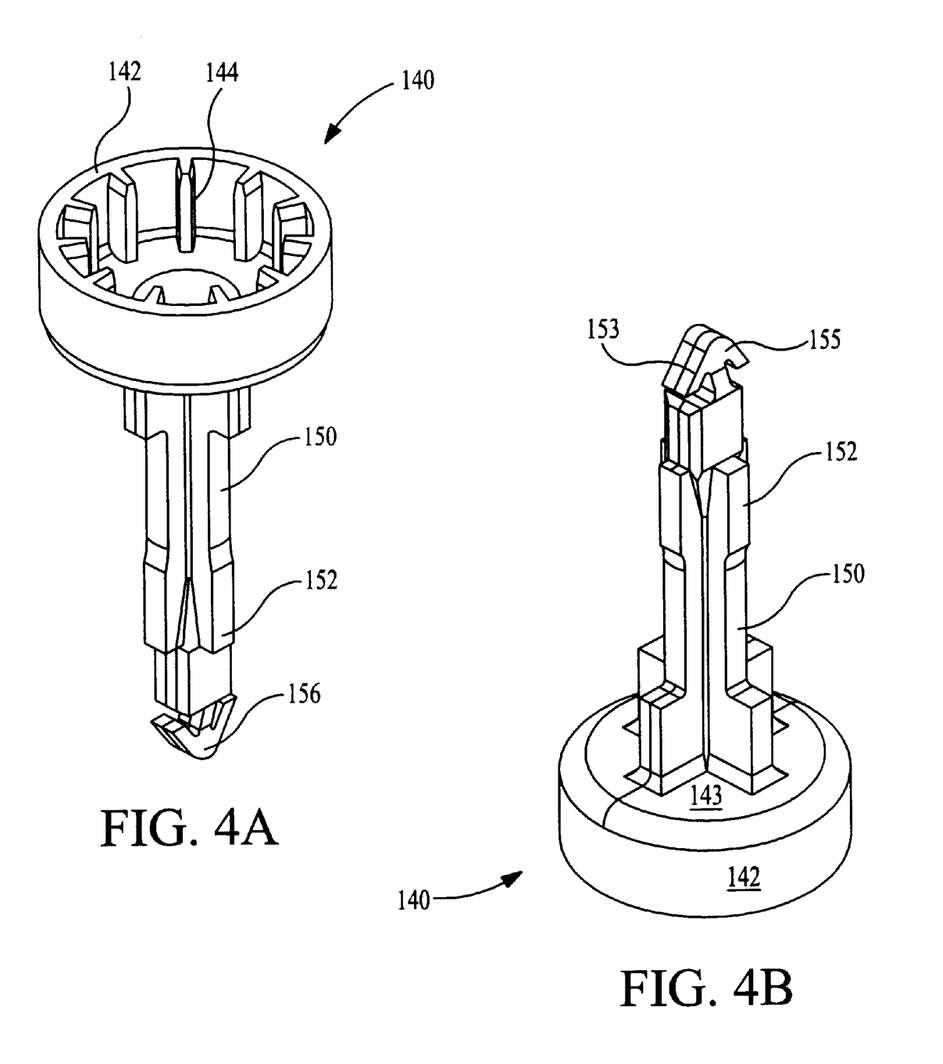
FIGS. 4A and 4B are perspective top and bottom views, respectively, of a meter dog of the adapter module.
Figure 5A:
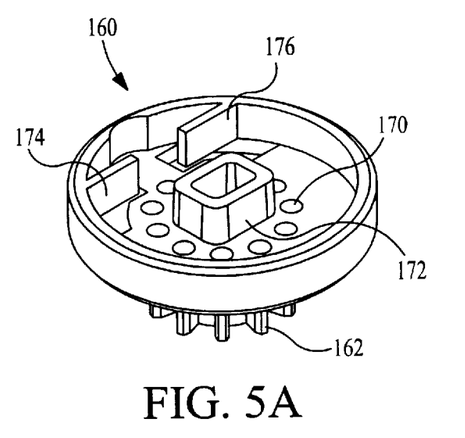
FIGS. 5A and 5B are perspective front and back views, respectively, of a dial dog.
Figure 5B:
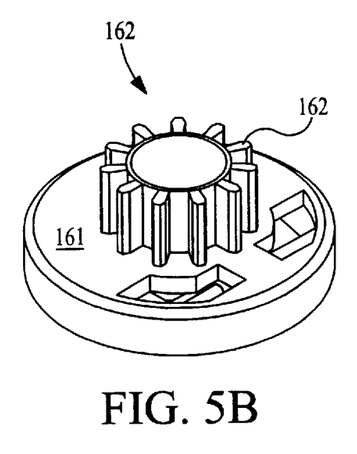

FIGS. 3A and 3B show the bracket 120 in more detail. The bracket 120 has a battery chamber 122 which in combination with the battery chamber 116 (FIG. 2B) houses one or more batteries. Further, the bracket 120 has a plurality of inner bosses 139 and 141 which allow the bracket 120 to be secured to the interface housing 20 using bolts. A recess 136 is also provided to receive a meter dog 140 (FIGS. 4A and 4B) and a meter dial dog 160 (FIGS. 5A and 5B).

As shown in FIG. 3A, grooves 121 and 123 run along side edges of the bracket 120. The grooves 121 and 123 allow air to vent from the bottom of the adapter module to the top of the adapter module. Additionally, weep holes 125, 127 and 129 allow water to drain from the adapter module 100. In combination, the venting relief provided by the grooves 121 and 123 and the draining action of the weep holes 125, 127 and 129 allow water to migrate outside of the adapter module 100, further protecting the integrity of components in the adapter module 100.

Figure 6A:
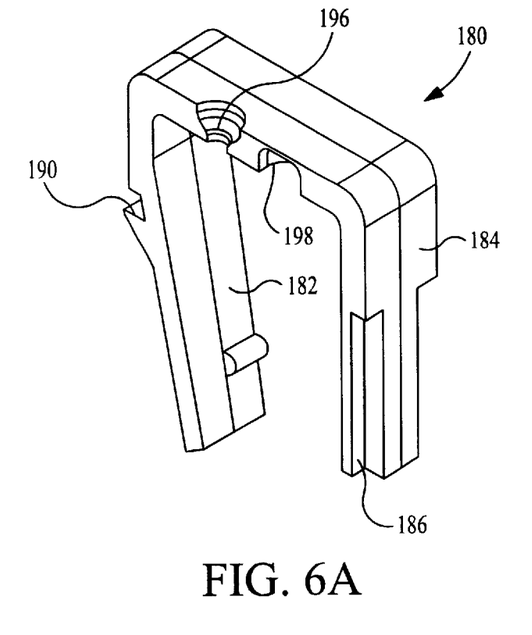
FIG. 6A is a perspective view of a battery door.
Figure 6B:
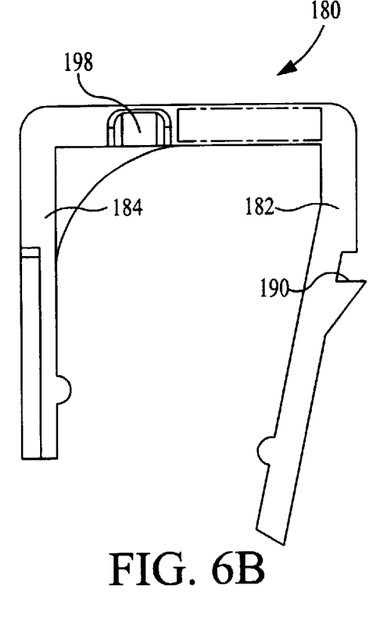
FIG. 6B is a side view of the battery door of FIG. 6A.

To provide an access path for electrical wires connecting the PCB to the battery, the bracket 120 provides a passageway 149 from the battery chamber 122 to the PCB mounted in the PCB chamber 135. To insulate the battery from moisture, a battery door 180, shown in more detail in FIGS.

6A and 6B, engages the passageway 149 to completely insulate the battery chamber 122 from the rest of the adapter module 100. Optionally, after the battery door 180 has been inserted into the passageway 149, a sealant may be injected into the passageway 149 via a semi-circular groove 147. In the event that the battery needs to be replaced, a field service technician can simply remove the cover 110 exposing the chamber 122 and replace the battery with a new one.

As shown in FIG. 3B, a plurality of bosses 124, 126, 128 and 130 are provided to receive and guide the bolts 102, 104, 106 and 108, which are also guided by bosses 103, 105, 107 and 109 (FIG. 2B). The gas meter module 100 may be secured to the dial index interface 20 by bolts inserted through the bosses 103, 105, 107 and 109 (FIG. 2B), and the bosses 124, 126, 128 and 130 (FIG. 3B). Also, rear ends 138 and 140 of bosses 139 and 141 house bolts for securing the bracket 120 to the meter 10.

The recess 136 has a base 134 which is adapted to engage a dial dog 160. The dial dog 160 rotates within the recess 136. As best shown in FIG. 5B, the dial dog 160 has a gear 162 which is adapted to engage and rotate the dials 109 after the adapter module 100 has been installed. Attached to the dial dog 160 is a meter dog 140 (FIGS. 4A and 4B). The meter dog 140 has a cylindrical shroud 142 to engage the gear on the original meter 10. As the gear on the original meter 10 rotates, the meter dog 140 rotates and drives the gear 162 on the dial dog 160. The rotation of the gear 162 in turn drives the dials 109 to provide a visual indication of consumption.

FIGS. 4A and 4B show in more detail the meter dog 140. As best shown in FIG. 4A, the meter dog 140 has a circular wall 142 with a plurality of gear interface teeth 144. These interface teeth engage with the gear interface of the original meter 10 to capture rotations from the gear interface of the original meter. These teeth are inserted over the original gear interface in a shroud-like manner to capture rotations from gears of the original meter. An elongated projection or arm 150 extends from a base 143 of the meter dog 140. Near the base 143 of the meter dog 140, the diameter of the elongated projection or arm 150 is increased to reduce the clearance between the elongated projection or arm 150 and the tube 132 that engages the projection or arm 150. The clearance reduction constrains the meter dog 140 to rotate without wobbling within the tube 132.

The elongated projection or arm 150 transmits torque information from the gears interface teeth 144 to a tip 156. The tip 156 has two wings 153 and 155. The tip 156 is adapted to engage an interlocking boss 172. When inserted, the tip 156 bends slightly upward and protrudes through one side of the dial dog 160. During the insertion process, the wings 153 and 155 are compressed. After the insertion, the angled sides of the wings 153 and 155 decompress and expand to form a secure lock with the dial dog 160.

FIGS. 5A and 5B show top and bottom perspective views of the dial dog 160. Turning now to FIG. 5A, the dial dog 160 has a gear interface 162 which is adapted to engage original dials on the original gas meter. Tangs 174 and 176 in combination hold in place a small button magnet (not shown) which senses rotations of the dial dog 160. An interlocking boss 172 is positioned on the bottom of the gear interface 162 and is adapted to engage the tip 156 of the meter dog 140 of FIGS. 4A and 4B. The interlocking boss 172 is of the same height as the height of the tangs 174 and 176.

The gear interface 162 is illustrated in more detail in FIG. 5B. The gear interface 162 is mounted on a base 161 of the dial dog 160. It has a cylinder from which a plurality of blades emanates. The blades are arranged so that they engage the respective receptacles on the dials of the meter 10 so that the dials on the original meter 10 may rotate as usual. The combination of the meter dog 140 and the dial dog 160 thus captures rotations from the original meter's dial interface, converts the rotations into a magnetic pulse for electronic detection using the magnet, and relays the rotations to the dials on the original meter 10 so that users can still manually read usage information from the dials if necessary.

Referring now to FIGS. 6A and 6B, a battery door 180 which may be inserted into the compartment 149 to insulate the battery chamber 122 from the rest of the adapter module 100 is shown. The battery door 180 has a two-legged portion: a front leg 182 and a rear leg 184. The rear leg 184 has a rectangular cut 186 which cooperates with one wall of the compartment 149 to guide the insertion of the battery door 180 into the compartment 149. Further, a latch 190 is provided on the front leg portion 182. During the insertion of the battery door 180, the latch 190 is pushed toward the front leg 182, and upon completion of the insertion, the latch 190 snaps into place and locks the battery door 180 in place.

The battery door has a side cut 198 to provide a better sealing when the encapsulant is injected. The side cut 198 provides sealing along the sides of the battery door. A semi-circular opening 196 compliments the semi-circular opening 147 in the bracket 127. Together, the openings 147 and 196 provide an access for sealant injection using a commonly available hypodermic needle.

Figure 7:
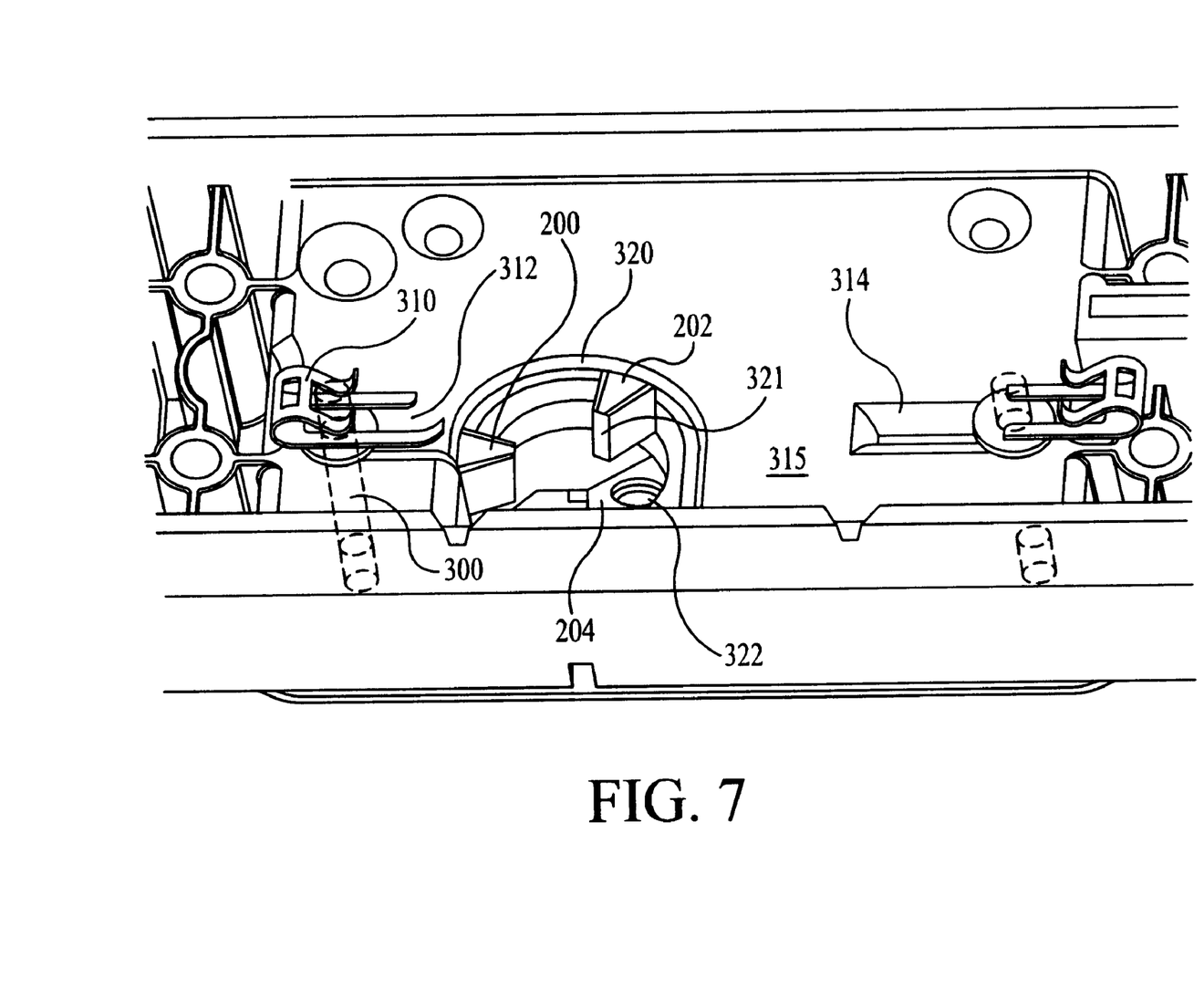
FIG. 7 is a perspective view of a portion of a second adapter module in accordance with the invention.

Referring now to FIG. 7, a second embodiment of the adapter module is shown. In FIG. 7, a dial clip 310 is mounted above a dial stand-off 300 to engage and secure a PCB. To simplify the mounting of the PCB, the dial clip 310 is adapted to slide in a groove in the stand-off 300. Moreover, the dial clip 310 has a plurality of small detents which allow installation personnel to feel a tactile snap when the clip 310 is correctly installed, as shown in a clip position 312.

To enable the clips to slide back and forth horizontally and to keep the clips from being dislodged during installation, grooves 312 and 314 are formed in a bracket piece that interfaces with a tongue (not shown) on the meter. These features in combination allow the adapter module to be assembled quickly in the field.

Additionally, the adapter module of FIG. 7 has a dial dog 320 with three posts 200–204. The posts 200–204 engage a tang or arm on the meter dial interface, capture rotations from the gear in the form of magnetic pulses, and provide the tang or arm rotations to the meter dials mounted on the face of the adapter module. The driving of the meter dials is done by a combination of a meter dog (not shown) and the dial dog 320 which interfaces with the tang or arm on the meter.

The dial dog 320 also houses a rotating magnet 322 which generates magnetic pulses in response to the meter gear rotations. These rotations are picked up by a magnetic switch on the PCB and converted into an electronic form suitable for transmission to a remote location.

Each of the posts 200–204 has a breakable arm 321 to handle problems associated with a cold spell where the dials mounted on the front of the adapter module may become saturated with frost or water and seize. In this case, the arm 321 breaks off so that the posts 200–204 can freely rotate and to generate a magnetic pulse. The pulse arising from rotation of the arm 321 may be digitized and relayed via a suitable transmission medium to a central computer at a remote location for consumption tracking and billing purposes. In this manner, the adapter module of FIG. 7 can continue to meter gas usage even though the meter dials are frozen.

As discussed above, the adapter module provides a beam-like reinforcement to the adapter module casing to prevent shearing and breaking of the adapter module in the field during installation as well as during operation.

Further, the low profile of the adapter module allows it to be deployed in a wide range of construction environments. Moreover, the battery chamber is insulated to protect the battery from the elements while allowing a quick and easy field-replacement of the battery.

While the invention has been shown and described with reference to an embodiment thereof, those skilled in the art will understand that the above and other changes in form and detail may be made without departing from the spirit and scope of the following claims.

What is claimed is:

1. An adapter coupleable to a utility meter having a meter gear and a dial, said adapter comprising:

a cover having a plurality of bosses extending from a front side of said cover to a rear side of said cover, each boss spaced a predetermined distance from a perimeter of said cover; and a battery chamber formed by a bracket and the cover, said battery chamber adapted to receive a battery;

a passageway connected to said battery chamber, said passageway adapted to be sealed to weatherproof said battery;

a recess formed by said bracket;

a meter dog mounted in said bracket coupleable to said meter gear; and a dial dog mounted in said recess and rotationally coupleable to said meter dog, said dial dog having a magnet mounted thereon to convert rotations associated with the meter gear into magnetic pulses.

2. The adapter of claim 1, wherein the dial dog drives the dial.

3. The adapter of claim 1, wherein the dial dog has tangs adapted to engage said magnet.

4. The adapter of claim 1, wherein said cover has a ledge for receiving a gasket.

5. The adapter of claim 1, further comprising a tamper-proof magnet housing formed on the inside of said cover.

6. The adapter of claim 1, further comprising a printed circuit board for converting the magnetic pulses into computer readable data.

7. The adapter of claim 1, wherein the dial dog has an interlocking boss and the meter dog has an arm for engaging the interlocking boss of the dial dog.

8. The adapter of claim 7, wherein the arm has a base and a projection mounted thereon, the projection having a tip for engaging the interlocking boss of the dial dog.

9. The adapter of claim 8, wherein said tip has snappable wings for securing the meter dog to the dial dog.

10. The adapter of claim 1, further comprising a battery door coupleable to said passageway.

11. The adapter of claim 10, further comprising an opening in said battery door for injecting a sealant into the passageway.

12. The adapter of claim 10, wherein said battery door has snappable legs for securely attaching said battery door to said passageway.

13. An adapter coupleable to a utility meter, said adapter comprising:

a cover having a plurality of bosses extending from a front side of said cover to a rear side of said cover, each boss spaced a predetermined distance from a perimeter of said cover; and a battery chamber formed by a bracket and the cover, said battery chamber adapted to receive a battery;

a recess formed by said bracket; and a dial dog mounted in said recess and rotationally coupleable to a meter dial, said dial dog having a breakable arm which is adapted to break and disengage said dial dog from the meter dials if the meter dials on the utility meter seize.

14. A method for retrofitting a utility meter having a dial interface with an adapter module having a battery chamber; a cover having a plurality of bosses extending from a front side of said cover to a rear side of said cover, each boss spaced a predetermined distance from a perimeter of said cover; a recess formed by said bracket; a meter dog mounted in said bracket coupleable to a meter gear; and a dial dog mounted in said recess and rotationally coupleable to said meter dog, said dial dog having a magnet mounted thereon to convert rotations associated with the meter gear into magnetic pulses, comprising:

coupling said adapter module to said dial interface;

secuing said adapter module to said utility meter; and weatherproofing the battery chamber of said adapter module.

15. The method of claim 14, wherein said support structure is a plurality of bosses and further comprising spacing the plurality of bosses within said predetermined distance for attaching the adapter module to the meter.

16. The method of claim 14, further comprising mounting a tamper detection circuit in said adapter module.

17. The method of claim 16, wherein the tamper-detection circuit placing step comprises mounting a magnet in the adapter module.

18. The method of claim 14, further comprising placing a bracket between the utility meter and a cover, the bracket and the cover forming a battery chamber.

19. The method of claim 18, further comprising providing a sealable passageway connected to the battery chamber.

20. The method of claim 14, wherein said bracket has a recess, further comprising mounting a dial dog in said recess.

21. The method of claim 20, further comprising inserting the tip of a meter dog into an interlocking boss of the dial dog.

22. The method of claim 14, further comprising detecting rotations of the dial interface.

23. The method of claim 22, further comprising transmitting the detected rotations to a remote location.

24. A method for retrofitting a utility meter having a dial interface and a dial with an adapter module having a battery chamber, comprising:

moving the dial from the utility meter to the front of the adapter module;

coupling said adapter module to said dial interface using a dial dog, the dial dog having a breakable arm which is adapted to disengage the dial dog from the dials when the dials on the adapter module seize;

securing said adapter module to said utility meter using a plurality of support structures spaced a predetermined distance from a perimeter of said adapter; and weatherproofing the battery chamber in said adapter module using a sealable passageway.

* * * * *